United States Patent [19]

Sakamoto et al.

[11] 4,313,223
[45] Jan. 26, 1982

[54] SIGNAL-AMPLIFICATION FREQUENCY-CONVERSION APPARATUS HAVING A COMMON ACTIVE COMPONENT

[75] Inventors: Kazuo Sakamoto; Takeshi Hayasaka, both of Tokyo, Japan

[73] Assignee: Nippon Electric Co., Ltd., Tokyo, Japan

[21] Appl. No.: 118,888

[22] Filed: Feb. 6, 1980

[30] Foreign Application Priority Data

Feb. 6, 1979 [JP] Japan .................................. 54-12580
Mar. 28, 1979 [JP] Japan .................................. 54-36493
Mar. 28, 1979 [JP] Japan .................................. 54-36495

[51] Int. Cl.³ .......................................... H04B 1/26
[52] U.S. Cl. .................................. 455/323; 455/20; 455/118; 330/4.5
[58] Field of Search .............. 455/20, 22, 24, 118, 455/126, 302, 313, 317, 323, 325, 330, 331; 330/4.5; 307/424

[56] References Cited

U.S. PATENT DOCUMENTS

| 3,334,299 | 8/1967 | Holzwarth | 455/22 |
| 3,341,783 | 9/1967 | Roulston | 455/325 |
| 3,663,886 | 5/1972 | Blume | 330/4.5 |
| 4,092,617 | 5/1978 | Titus | 455/126 |

OTHER PUBLICATIONS

Kawahashi et al., "Solid-State 4 GHZ 1200-Channel System", IEEE International Communications Conference, Philadelphia, Jun. 1966.

*Primary Examiner*—Jin F. Ng
*Attorney, Agent, or Firm*—Sughrue, Mion, Zinn, Macpeak and Seas

[57] ABSTRACT

A frequency-conversion apparatus including, among others, a single active component in common use for signal amplification and local oscillation with its operating point selected in its linear region, but not in its saturation region. With this device, there is no need for any special components conventionally used in this type of apparatus, such as a nonlinear circuit for controlling oscillation output and an extraction circuit for feeding the local-oscillation signal to the frequency mixer as conventionally arranged outside of the oscillation loop.

14 Claims, 11 Drawing Figures

SIGNAL-AMPLIFICATION FREQUENCY-CONVERSION APPARATUS HAVING A COMMON ACTIVE COMPONENT

BACKGROUND OF THE INVENTION

This invention relates to signal amplification frequency-conversion apparatus and more particularly to those of the type including a common or single active component.

Recently, with expansion of the operation frequency range, increase in output and reduction in cost of high-frequency use transistors, such as silicon bipolar transistors and GaAs field-effect transistors, attempts are being made to realize microwave transmitters/receivers in a wholly solid-state form. Such form of transmitter/receiver will obviously be advantageous over the conventionally one, of the travelling-wave tube type, in reliability, cost performance and power consumption.

In the transmitter section of a heterodyne microwave transmitter/receiver for relay use, the transmission frequency-converter generally includes a frequency mixer at which the intermediate-frequency signal and the local signal are frequency-converted to a transmission signal frequency, and a transmission power amplifier section where the transmission signal is power-amplified for transmission. Further, in a reception frequency converter such as used in the receiver section of the transmitter/receiver of the type described or generally in a heterodyne microwave receiver unit, the received signal as leaving the branching filter is amplified by a high-frequency preamplifier and then, at a frequency mixer, is mixed with the local-oscillation signal and frequency-converted into an intermediate frequency. Such transmission and reception frequency converteres serve the functions of signal amplification, frequency mixing and local oscillation and, for reduction in size and cost, it has previously been proposed to make use of a single or common active component to serve both the local oscillation and signal amplification functions.

The amplification-oscillation circuit including a common active component, however, has been problematic because steady state of oscillation is established in the saturation range of the active component. Specifically, letting A be the amplification factor of the active component and $\beta$, the feedback factor by the feedback circuit, it is required that, to maintain the oscillation once started, the sum of the phase component (Ap) of the amplification factor and the phase component ($\beta$p) of the feedback factor is zero and $|A\beta|>1$, and that, in the steady state, $Ap+\beta p=0$ and $|A\beta|=1$ are satisfied. In other words, in positive feedback, as long as $|A\beta|>1$, the operating point of oscillation shifts into the saturation region of the active component as the oscillation starts to develop and the amplification factor. A starts to decrease with saturation of the active component until the oscillation is stabilized at the saturation point, where $|A\beta|=1$.

With the operating point of oscillation thus lying in the saturation region of the active component, it will be noted that the signal to be amplified and the oscillation output markedly interfere with each other in cases where a single active component or a single active-component circuit unit is used in common for oscillation and amplification purposes. Such interference causes increase of the intermodulation distortion. Further, the level of oscillation output, which depends upon the saturation level of the active component, becomes less stable, widely varying with the level of signal to be amplified, as the latter approaches the saturation level of the active component. Such unstable oscillation output is inappropriate as a local oscillation output for reception or transmission use.

A transmitter/receiver apparatus, designed to solve such problems of intermodulation distortion and oscillation output level and including a single travelling-wave tube amplifier used in common for amplification and oscillation, has been proposed by T. Kawahashi et al., as seen in the article entitled "Solid-State 4 GHz 1200-Channel System," IEEE International Communications Conference, Philadelphia, June 1966. The apparatus proposed includes a nonlinear circuit, called "local power control (LPC)," inserted in the feedback loop forming an oscillation circuit for the purpose of stabilizing the oscillation output. As apparent, this apparatus is so arranged that the oscillation is effected in the unsaturated region of the amplifier, in order to avoid such problems as intermodulation distortion. Also, in the apparatus, the frequency mixing is effected by mixing the oscillation output extracted from the oscillation loop by means such as a directional coupler with the received signal.

The apparatus proposed by T. Kawahashi et al. is advantageous in that use is made of a single amplifier for both amplification and oscillation purpose but is complicated in structure and uneconomical as it includes an LPC circuit especially provided for stabilization of the oscillation output and oscillation in the linear region of the amplifier and as the frequency mixer is provided exteriorly of the oscillation loop.

SUMMARY OF THE INVENTION

Under the circumstances described above, the present invention has for its object the provision of an amplification frequency-conversion apparatus which includes a single or common active component capable of serving both the amlification and oscillation purposes without involving any deterioration in performance and is particularly simplified in structure.

According to the present invention, there is provided a frequency-conversion apparatus of the type adapted to mix a signal of a first frequency and a signal of a second frequency for frequency conversion to a signal of a third frequency, characterized in that it comprises: an input section to which said first-frequency signal is supplied; amplifier means to which the output of said input section and said second-frequency signal are supplied and serving to amplify both signals; frequency-mixer means having a nonlinear element for frequency-mixing said first-frequency and second-frequency signals output from said amplifier means to produce said third-frequency signal-wherein said nonlinear element is set to cause a part of said second frequency signal to be reflected; and positive feedback means for supplying the reflected signal to the amplifier means to drive said amplifier means into oscillation at the second-frequency, the level of the reflected signal being set so that the amplification and oscillation operations of said amplifier means are effected in a linear region thereof.

The above and other objects, features, advantages of the present invention will become apparent from the following description when taken in conjunction with the accompanying drawings, which illustrate a few preferred embodiments of the invention.

DESCRIPTION OF THE PREFERRED EMBODIMENTS

Figure 1:
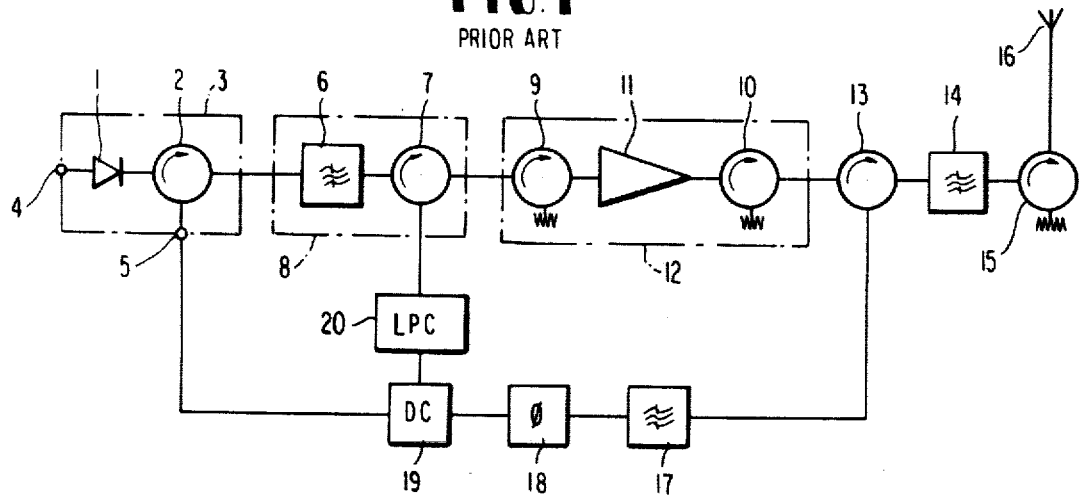
FIG. 1 is a block diagram of a conventional form of transmission frequency-conversion apparatus for heterodyne relay use.

Referring to FIG. 1, reference numeral 3 indicates a frequency mixer consisting of a mixer diode 1 and a circulator 2 and serving to mix the intermediate-frequency signal fed to a terminal 4 with a local-oscillation signal entering at another-terminal 5 thereby to form a transmission signal. The transmission signal thus formed by frequency conversion is fed to a combining filter 8 comprised of a band-pass filter (BPF) 6 and a circulator 7. The BPF 6 has its center frequency set equal to the frequency of the transmission signal. The output of circulator 7 is amplified by a transmission power amplifier circuit 12 including an amplifier 11 protected at opposite ends by isolators 9 and 10 and is then fed to a circulator 13. The output of circulator 13 is directed through a BPF 14 having a center frequency equal to the frequency of the transmission signal and through an isolator 15 so as to be transmitted from an antenna 16.

On the other hand, the local-oscillation signal is produced by means of a feedback loop in which the signal starting at the circulator 13 and proceeding through a BPF 17, a phase adjuster 18, a directional coupler 19, a local power control (LPC) circuit 20 and the circulator 7, is reflected at the BPF 6 to reach the input end of the amplifier circuit 12. It is to be noted that the LPC circuit 20 is a nonlinear circuit provided to prevent power fluctuation or cessation of oscillations of the local-oscillation signal. The BPF 17 has its center frequency set equal to the frequency of the local-oscillation signal. The phase adjuster 18 serves the purpose of adjusting the phase of the feedback signal so as to render the feedback loop positive. The directional coupler 19 is provided to feed the local signal also to the frequency mixer 3.

Figure 2:
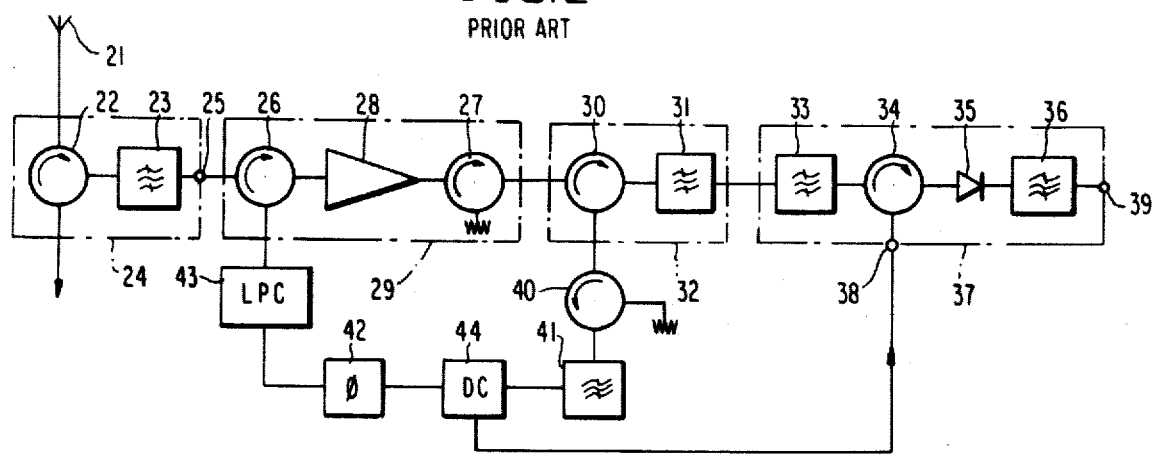
FIG. 2 is a block diagram of a conventional form of reception frequency-conversion apparatus for heterodyne relay use.

Referring next to FIG. 2, a branching filter circuit 24, comprised of a circulator 22 and a BPF 23, allows only the desired signal component of the incoming signal received by a receiving antenna 21 to proceed to the terminal 25. The output from the terminal 25 is amplified by a high-frequency preamplifier circuit 29, which includes an amplifier 28 protected at its input and output ends by a circulator 26 and an isolator 27, respectively. The amplified output is fed to a mixer circuit 37 by way of a branching filter 32, comprised of a circulator 30 and a BPF 31. The mixer circuit 37 is comprised of a band-rejection filter (BRF) 33, having a rejection center frequency set at the frequency of the local-oscillation output, a circulator 34, a mixer diode 35, and a BPF 36, having a pass center frequency equal to the intermediate frequency. At the mixer diode 35, the signal passing through BRF 33 and the oscillation output fed at a terminal 38 to proceed through the circulator 34 and reflected by the BRF 33 are mixed to form an intermediate-frequency signal, which is directed to another terminal 39.

The oscillation output is obtained by the provision of a feedback loop in which the signal from the branching filter 32 passes through an isolator 40, a BPF 41, a directional coupler 44, a phase adjuster 42, an LPC 43 and the circulator 26 and is reflected at BPF 23 to return to the input circulator 26 in the high-frequency preamplifier circuit 29. The oscillation output thus obtained is branched from the oscillation loop at directional coupler 44 to be fed to the terminal 38 of mixer circuit 37 for frequency conversion. The LPC 43, phase adjuster 42 and BPF 41 serve the same functions, respectively as the LPC 20, phase adjuster 18 and BPF 17 shown in FIG. 1. The isolator 40 is inserted to absorb waves reflected by BPF 41.

For the details of the transmission frequency-conversion apparatus described in connection with FIG. 1, reference may be had to the above-cited article by T. Kawahashi et al. For the details of operation of the LPCs 20 and 43, reference may be had to U.S. Pat. No. 3,104,359.

As apparent from the description made of FIGS. 1 and 2, transmission or reception frequency-conversion apparatus conventionally employs a single amplifier for amplification of the transmission or reception signal and also oscialltion of a local signal. Such apparatus, however, necessitates, for frequency mixing, use of a directional coupler to enable extraction of the oscillation output from the feedback loop. In addition, in order to stablize the local oscillation power, an LPC circuit must be inserted in the feedback loop. Also, a combining filter 8 for applying the local-oscillation signal to the transmission power amplifier circuit or a branching filter 32 for extraction of the local-oscillation signal is needed.

According to the present invention, an amplification frequency-conversion apparatus is provided which is particularly simplified in circuit construction, not including any LPC circuit, means for extracting the local-oscillation signal or a combining or branching filter.

Figure 3:
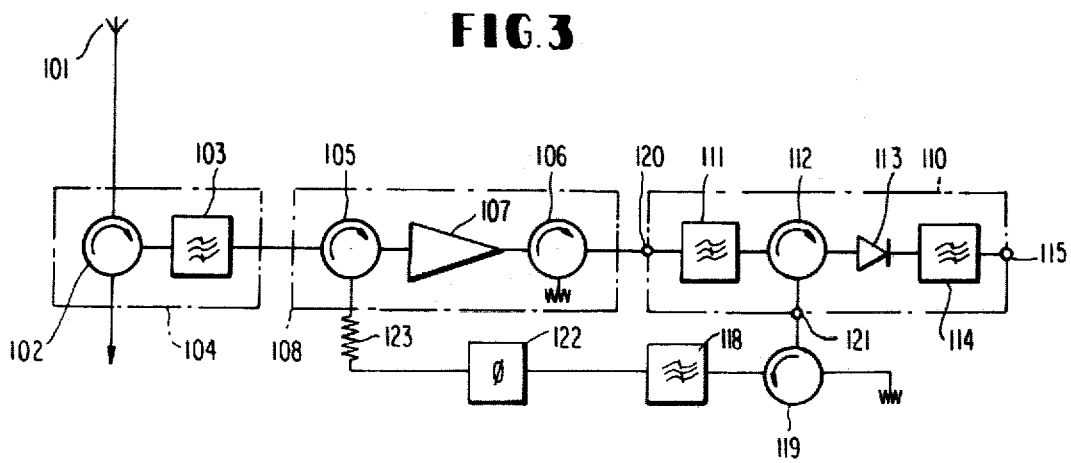
FIG. 3 is a block diagram illustrating a first embodiment of the present invention.

FIG. 3 illustrates in blocks a preferred form of amplification frequency-conversion apparatus embodying the principles of the present invention and usable on the receiving side such as of a heterodyne relay station. Description will now be made of the arrangement and operation of the apparatus as used to amplify a high-frequency signal and obtained an intermediate-frequency signal therefrom. Reference numeral 104 indicates a branching circuit comprised of a circulator 102 and a BPF 103 and arranged so that only the desired signal component of the incoming signal received by a receiving antenna 101 is directed to a high-frequency preamplifier circuit 108. The signal entering the latter circuit is amplified by an amplifier 107 protected at its input and output ends by a circulator 105 and an isolator 106, respectively, and the signal amplified is fed through a BRF 111 and a circulator 112 to a mixer diode 113. The BRF 111 is inserted for elimination of the image frequency of the reception signal relative to the local-oscillation signal and has its rejection center frequency set at the image frequency.

On the other hand, the local-oscillation signal is given rise to by the provision of a feedback loop in which the signal from the output end of the high-frequency preamplifier circuit 108 proceeds through a frequency mixer 110, an isolator 119, a BPF 118, a phase adjuster 122 and an attenuator 123 an is reflected by the branching circuit 104 to return to the input end of the high-frequency preamplifier circuit 108. In other words, the high-frequency preamplifier 108 is set into oscillation with the phase of signal adjusted for positive feedback by the phase adjuster 122 and the feedback factor set at an optimum value by the attenuator 123. The local-oscillation signal is impressed together with the reception signal upon the mixer diode 113 where the reception signal is converted to an intermediate-frequency signal whose frequency corresponds to the difference between the reception and local-oscillation signals frequencies. The intermediate-frequency signal, passing through a BPF 114, is taken at an output end 115.

Figure 4:
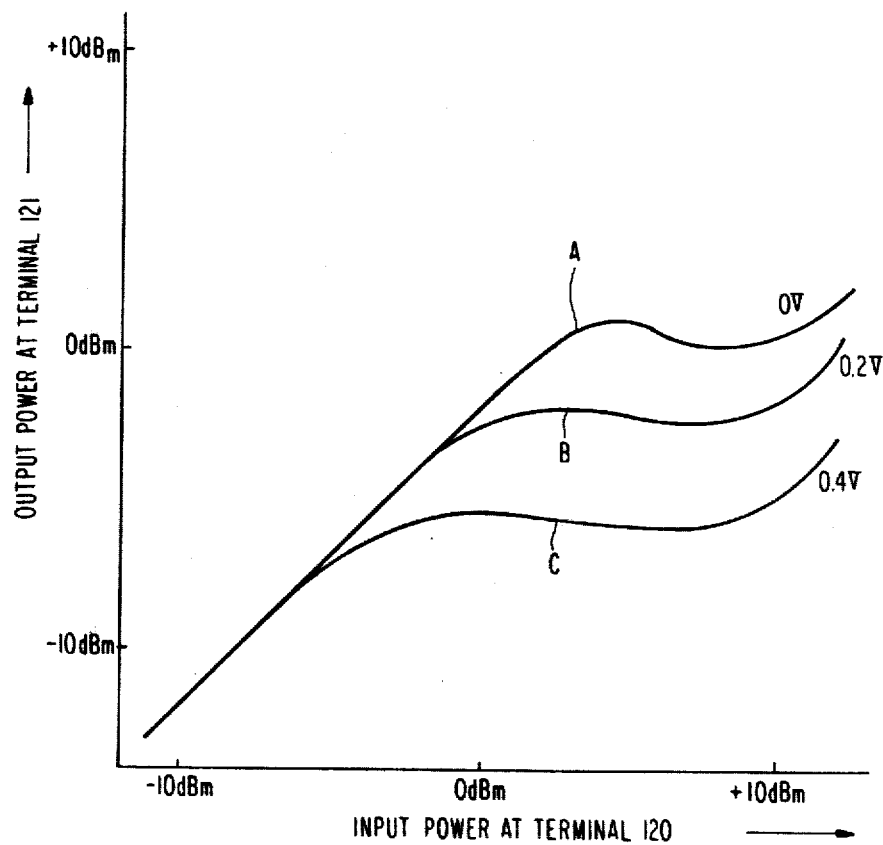
FIGS. 4 and 5 are characteristic diagrams explanatory of the operation of the apparatus shown in FIG. 3.

The operation of the present invention will next be described in further detail with reference to the characteristic diagram of FIG. 4, in which reference characters A, B and C indicate examples of saturation characteristic relative to the local-oscillation signal, as actually measured of the frequency mixer 110 having an input end at terminal 120 and an output end of terminal 121 in FIG. 3.

In FIG. 3, the local-oscillation signal as obtained with the high-frequency preamplifier 108 placed under positive feedback is impressed together with the amplified reception signal upon the terminal 120 and further, through BRF 111 and circulator 112, upon the mixer diode 113. The frequency mixing is effected with the nonlinear resistive operation of the mixer diode 113 when the high-frequency amplitude, exceeding the forward voltage of the mixer diode 113, enters into its forward region. It is to be noted that the mixer diode 113 is in a state so adjusted that impedance matching is obtained when in a nonlinear condition of operation.

Accordingly, as long as the local-oscillation signal level as impressed upon the input terminal 120 is low, the local-oscillation signal is substantially totally reflected at the mixer diode 113 to appear at the output terminal 121 unchanged. With rise of the local-oscillation signal level, as its amplitude starts to exceed the forward voltage of the mixer diode 113, impedance matching starts gradually to be effected so that the reflected power appearing at the terminal 121 becomes substantially constant despite of the high level of the local-oscillation signal. However, with further rise of the local signal level, the impedance matching is impaired by degrees and the reflected power starts again to increase. Such characteristic of the local-oscillation signal having the input and output ends at terminals 120 and 121, respectively, has a region of saturation as observed in FIG. 4 on the curve A, which represents actual values measured.

Further, it will be noted that the magnitude of amplitude of the high-frequency voltage required to reach the forward rise voltage of the mixer diode 113 can be varied by applying a d-c bias voltage to the mixer diode and, in this manner, the saturation level of the local-oscillation signal can be varied as desired. The curves B and C in FIG. 4 represents saturation characteristics having different saturation levels with a d-c bias voltage, respectively, of 0.2 V and 0.4 V, applied to the diode 113.

Figure 5:
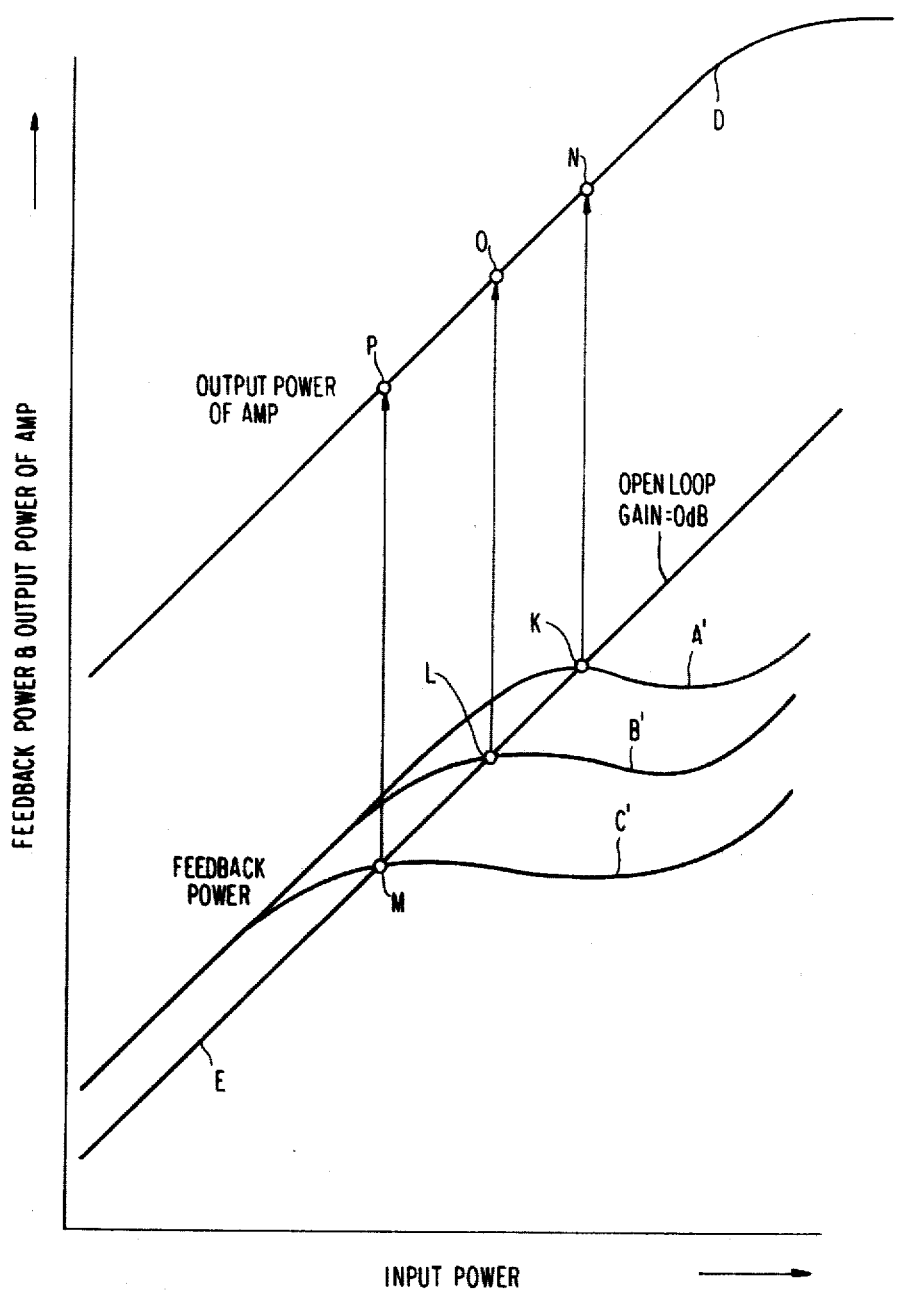

FIG. 5 is another explanatory diagram of the operation of the present invention which is obtained with the feedback loop opened between the BPF 118 (FIG. 3) and the phase adjuster 122 and, on which diagram, the abscissa represents the level of input to the phase adjuster 122, the ordinate representing the level of output of the filter 118 and the amplifier circuit 108. Illustrated in this diagram are open-loop characteristics of the feedback loop of FIG. 3 in which the signal from the output end of the high-frequency preamplifier 108 is directed through the frequency mixer 110, and isolator 119, the BPF 118, a phase adjuster 122, and an attenuator 123 and is reflected by the branching filter circuit 104 to return to the input end of the high-frequency preamplifier circuit 108. In FIG. 5, the curves A', B' and C' represent the open-loop input-output characteristics, corresponding, respectively, to the curves A, B and C of FIG. 4. Reference character D represents the output characteristic of the high-frequency preamplifier 108; E indicates a straight line of the 0 dB gain of the open loop; and K, L and M indicate the points of intersection of the straight line E with curves A', B' and C', respectively. Reference characters N, O and P indicate the operating points of the high-frequency preamplifier 108 as corresponding to the feedback power at the points of intersection K, L and M, respectively.

Referring again to FIG. 3, the local-oscillation signal and the reception signal are both impressed upon the terminal 120 to form an intermediate-frequency signal upon frequency conversion and are partly reflected to appear at the terminal 121. As long as the level of the local-oscillation signal is sufficiently high compared with that of the reception signal and the power reflected of the reception signal is blocked at BPF 118, there appears on the output side of the filter 118 the saturation characteristic of the local-oscillation signal, which is the same as that shown in FIG. 4. Accordingly, with the feedback of loop of FIG. 3 opened, for example, between the BPF 118 and the phase adjuster 122, there will be obtained input-output characteristic as represented by the curves A', B' and C' in FIG. 5, provided the d-c bias voltage to mixer diode 113 and the attenuation rate of attenuator 123 are properly selected at the center frequency of BPF 118 in the loop opened and having its input and output ends on the phase adjuster (122) side and on the BPF (118) side, respectively. Under this condition, the high-frequency preamplifier 108 has an output characteristic shown in FIG. 5 by curve D.

The feedback loop having such open-loop characteristics is adjustable in phase for perfect positive feedback by means of the phase adjuster 122 so that a stable oscillation is obtained at the points of intersection K, L and M, where the gain of such open loop is 0 dB, for the respective values of d-c bias voltage to the mixer diode 113. In such condition, the high-frequency preamplifier 108 operates at points N, O and P, corresponding to the respective points of intersection K, L and M, in accordance with the d-c bias voltage values for the mixer diode 113. The operating points N, O and P correspond to the respective levels of the local-oscillation signal and any desired local-oscillation signal level is obtainable by properly selecting the value of d-c bias voltage for the mixer diode 113.

As observed in FIG. 5, these operating points of the high-frequency preamplifier 108 lie in the linear region thereof. It follows, therefore, that, between the local-oscillation and receive signals, for both of which the high-frequency preamplifier is utilized in its linear region, there occurs no noticeable mutual interference and any deterioration of the noise figure for the reception signal being amplified or influences of the reception signal level upon the local-oscillation signal level will be substantially eliminated. This enables common use of the high-frequency preamplifier for the local-oscillation and reception signals and omission of any active circuit provided exclusively for local oscillation, and hence substantial reduction in cost and power consumption of the apparatus is attainable.

Figure 6:
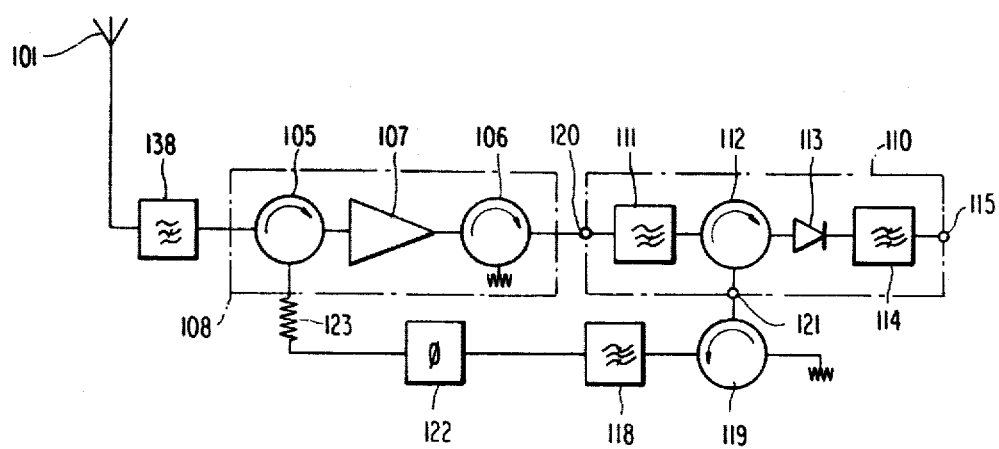
FIGS. 6 and 7 are block diagrams of second and third embodiments of the present invention, representing modifications in the apparatus shown in FIG. 3.

Referring to FIG. 6, which illustrates a second embodiment of the present invention, reference numeral 138 indicates a band-rejection filter provided for blocking the frequency of local-oscillation signal. In this embodiment, otherwise similar to that shown in FIG. 3, the band-rejection filter 138, having a rejection center frequency equal to that of the local-oscillation signal, acts to reflect the feedback power of the local-oscillation signal, as applied to one arm end of the circulator 105, into the high-frequency preamplifier 108 thereby to form a feedback loop.

Figure 7:
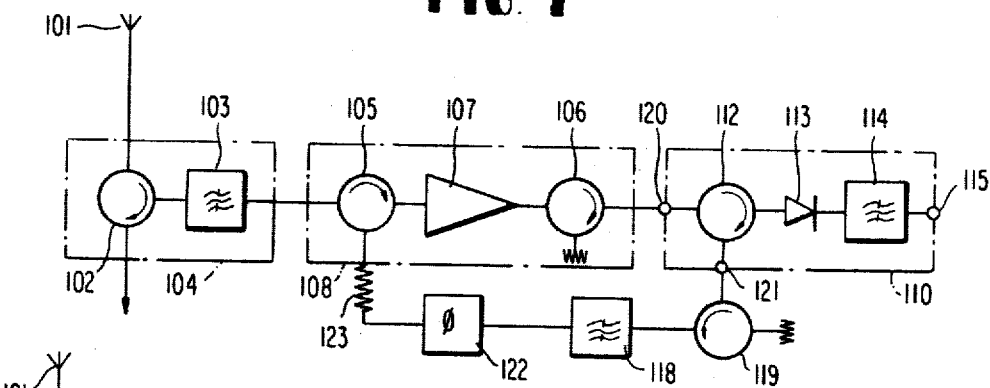

FIG. 7 illustrates a third embodiment of the present invention usable in cases where the noise figure is not much worth consideration. This embodiment is similar to the apparatus of FIG. 3 except that the band-rejection filter 111 in FIG. 3 is omitted. Only, in this embodiment, the noise figure is slightly impaired due to the thermal noise of the preamplifier 108 at the center frequency of the BRF 111.

Figure 8:
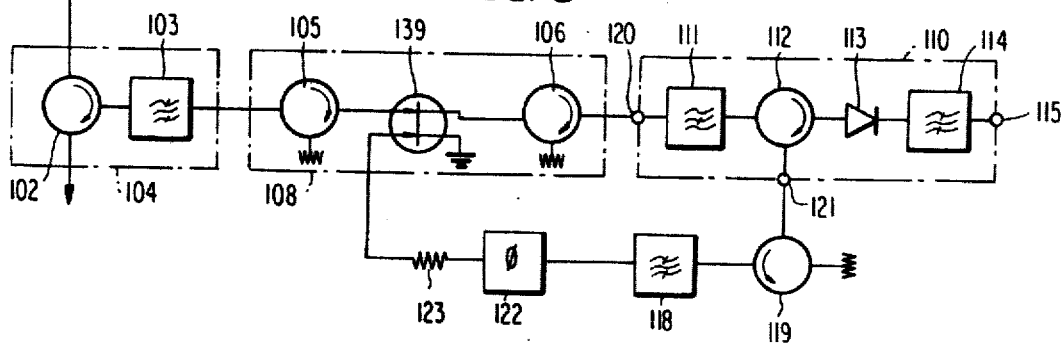
FIG. 8 is a block diagram showing a fourth embodiment of the present invention.

FIG. 8 diagrammatically illustrates an amplification frequency-conversion apparatus employing an active component in the form of a dual-gate GaAs FET, as indicated at 139, and otherwise similar to the apparatus of FIG. 3. With this embodiment, the problems of leak of the local-oscillation signal at the receiver end and of unnecessarily extended length of the feedback circuit are to be solved.

The gates of dual-gate GaAs FET 139 are electrically independent so that the feedback circuit length can be made short compared to that of the apparatus of FIGS. 3, 6 and 7 by applying the reception signal to one gate for amplification while applying the feedback signal of the local-oscillation signal to the other gate, as indicated by the arrows in FIG. 8. Further, the leak of the local-oscillation signal from BPF 103 or BRF 138 to any other receiver unit is reduced by an amount corresponding to the sum of the isolation between the gates of dual gate GaAs FET 139 and that of isolator 105.

Figure 9:
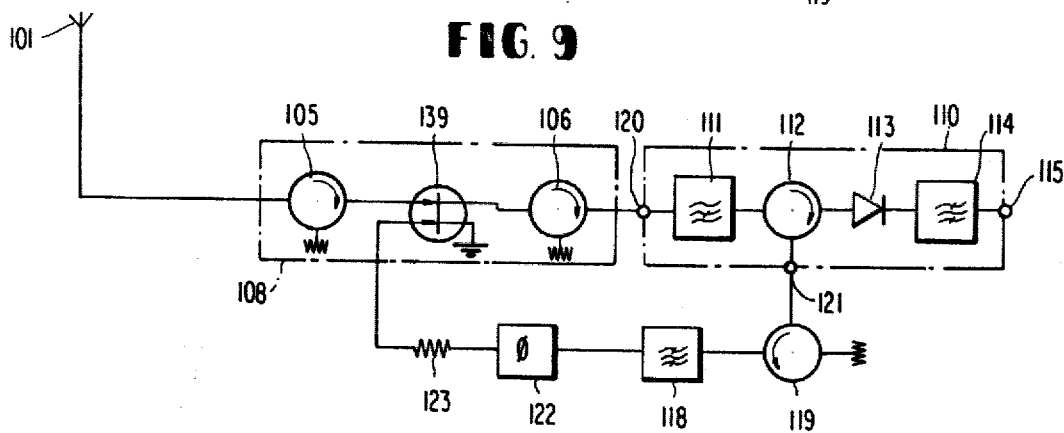
FIG. 9 is a block diagram showing a fifth embodiment of the present invention, representing a modification in the apparatus of FIG. 8.

FIG. 9 diagrammatically illustrates a fifth embodiment of the present invention, which is a modification of the apparatus of FIG. 8, not employing any branching filter circuit (104) at the reception-signal input end. Otherwise, this embodiment is the same as that of FIG. 8. In the embodiment of FIG. 8 or 9, in cases where the noise figure is not much worth consideration, the BRF 111 can be safely omitted as in the embodiment of FIG. 7.

Figure 10:
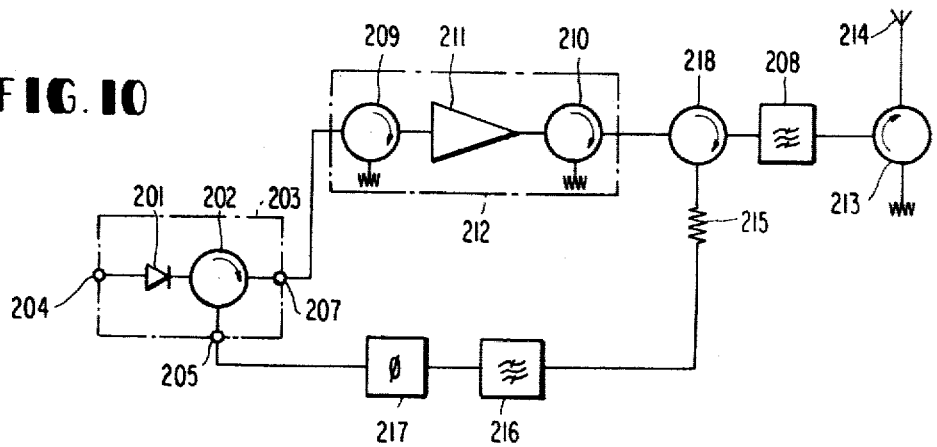
FIG. 10 is a block diagram of a sixth embodiment of the present invention.

FIG. 10 illustrates a further form of amplification frequency-conversion apparatus embodying the present invention and capable of frequency conversion of a certain signal to another signal and amplification of the latter signal. Description will be made here of the apparatus as used to obtain a high-frequency transmission signal from an intermediate-frequency signal and to amplify the transmission signal obtained. In this apparatus, the frequency mixer section 203 thereof is fed at a terminal 204 with the intermediate-frequency signal and at another terminal 205 with the local-oscillation signal and the signal frequency-converted at a mixer diode 201 to the transmission-signal frequency appears at a terminal 207, passing through a circulator 202. The output from the terminal 207 is power-amplified by a transmission power amplifier circuit 212 and hence fed through a circulator 218 to a BPF 208 and the transmission signal selected by the BPF 208 is passed through a circulator 213 to be delivered from an antenna 214. It is to be noted that the BPF 208 has its center frequency set at the transmission-signal frequency.

On the other hand, the local-oscillation signal is obtained by the provision of a feedback loop arranged so that the output signal from the power amplifier circuit 212, proceeding through the circulator 218, is reflected by the BPF 208 and, proceeding through the circulator 218, attenuator 215, BPF 216, phase adjuster 217 and circulator 202, is partly reflected by the mixer diode 201 to return through the circulator 202 to the input end of the power amplifier circuit 212. For actual generation of the local-oscillation signal, the power amplifier 212 is set into oscillation with the feedback loop phased for positive feedback by means of the phase adjuster 217 and the feedback factor set at an optimum value by the attenuator 215. The local-oscillation signal thus produced is applied, for frequency conversion to the transmission signal, to the mixer diode 201 together with the intermediate-frequency signal. It will be apparent, therefore, that the amplification frequency-conversion apparatus just described employs the amplifier 211 in common for power amplification of the transmission signal and for local signal oscillation.

The principles of operation of the amplification frequency-conversion apparatus shown in FIG. 10 are substantially the same as those previously described in connection with the first to fifth embodiments of the invention. In the FIG. 10 apparatus, it will be noted that the local-oscillation signal applied to the mixer diode 201 is partly frequency-converted with the intermediate-frequency signal into the transmission signal but the rest of it is reflected intact to the amplifier circuit 212 to be amplified together with the transmission signal. The local-oscillation signal amplified is directed through the circulator 218 into the feedback loop while the transmission signal is directed to the output terminal 213 of the apparatus.

Figure 11:
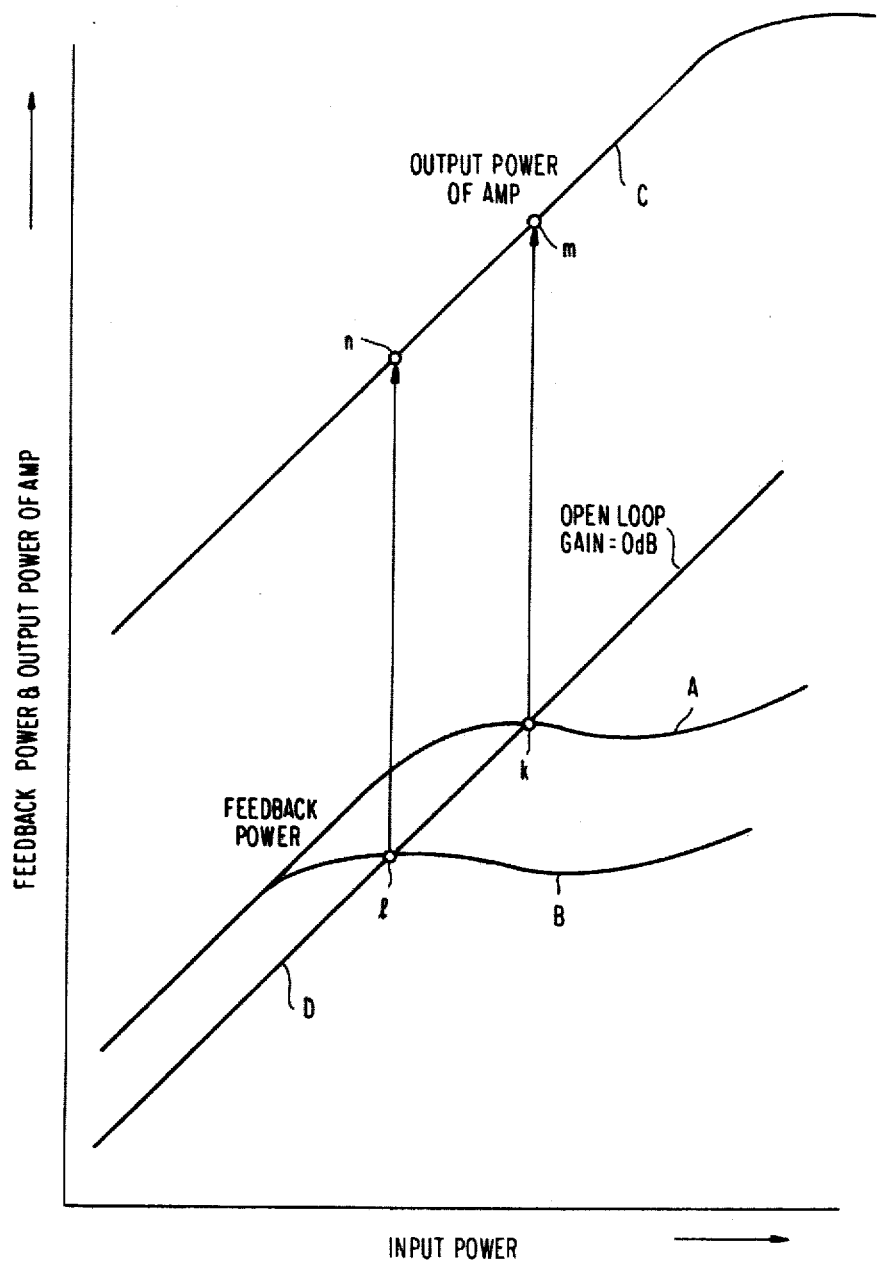
FIG. 11 is a characteristic diagram explanatory of the operation of the apparatus shown in FIG. 10.

The input-output characteristic of the local-oscillation signal as flowing from terminal 205 to terminal 207 is of the saturation type, as shown by the curve A or B in FIG. 11, where the abscissa represents the input power to the mixer section 103 and the ordinate represents the feedback loop power and the output power of amplifier 211. Frequency-mixing operation of the mixer diode 201 is in fact a nonlinear operation obtainable when the high-frequency signal amplitude, exceeding the forward voltage of the mixer diode, enters into its forward region. It is to be understood that the mixer section 203 is so adjusted that impedance matching is obtained with the nonlinear state of operation of the mixer diode 201. As seen from the input-output characteristic A or B of the mixer diode 201 in relation to the local-oscillation signal, the local-oscillation signal is totally reflected by the mixer diode 201 to appear at the terminal 207 unchanged as long as the level of the local-oscillation signal applied is low. Subsequently, with rise of the local signal level, as its amplitude comes to exceed the forward rise voltage of the mixer diode 201, impedance matching is gradually obtained so that the reflected power appearing at the terminal 207 is held substantially constant despite the rise of the local-oscillation signal level. With further rise of the signal level, the impedance matching is gradually impaired and the reflected power starts again to increase.

Characteristic curves A and B are obtainable with respective different d-c bias voltages applied to the mixer diode 201. In other words, the value of high-frequency amplitude required to reach the forward voltage of the mixer diode 201 can be varied as desired by varying the d-c bias voltage applied thereto and, in this manner, the saturation level of the feedback power can be varied as desired.

Referring to FIG. 10, the open-loop input-output characteristic of the feedback loop as opened between the phase adjuster 217 and terminal 205 can be made quite the same as that represented by the curve A or B in FIG. 11, provided the attenuation rate of attenuator 215 and the bias voltage to the mixer diode 201 are properly selected. Under this condition, it will be noted that the saturation character of the open-loop input-output characteristic can be determined by the saturation characteristic of the frequency-mixer section 203, but not by the saturation region of the transmission power amplifier circuit 212.

The output characteristic of the transmission power amplifier circuit 212 in the condition set as described above is represented by curve C in FIG. 11. When the loop having an open-loop characteristic such as represented by curve A or B is phase-adjusted for positive feedback by the phase adjuster 217 so as to form a closed loop, a stable oscillation is obtained at the point k or l where the open-loop gain is 0 dB in accordance with the d-c bias voltage applied to the mixer diode 201. In this state, the operating point of power amplifier circuit 212 is indicated in FIG. 11 at m or n. Such operating point m or n, corresponding to the respective level of local-oscillation signal, can be varied in accordance with the desired level of local-oscillation signal by properly selecting the d-c bias voltage of mixer diode 201. In this manner, the operating point of the power amplifier circuit 212 for local oscillation can be set in its linear region.

As will be apparent from the foregoing description, according to the present invention, a single active component can be used in common for amplification and local oscillation and the operating point of such local oscillation can be set in the linear region of the active component. As a consequence, the dependency of the oscillation output level upon the signal level to be amplified can be held substantially unchanged, making it possible to minimize the intermodulation distortion.

Further, according to the present invention, a mixer diode as incorporated in the positive feedback loop is usable for setting the operating point of oscillation and this enables omission of any exclusive active component for oscillation use without necessitating any additional circuits such as LPC and combinating or branching filter circuits conventionally used as shown in FIG. 1 or 2 and thus enables substantial reduction in cost and power consumption of the apparatus.

What is claimed is:

1. A frequency-conversion apparatus adapted to frequency-mix a signal of a first frequency and a signal of a second frequency for frequency conversion to a signal of a third frequency, said frequency-conversion apparatus comprising
an input section to which said first-frequency signal is supplied;
amplifier means supplied with the output of said input section and with said second-frequency signal for amplifying both said first- and second-frequency signals;
frequency-mixer means having a nonlinear element supplied with the amplified first- and second-frequency signals from the output of said amplifier means for frequency-mixing said first- and second-frequency signals to provide said third-frequency signal, said nonlinear element being set to cause a part of said second-frequency signal to be reflected as a reflection component; and
positive feedback means for supplying said reflection component to said amplifier means to drive said amplifier means into a frequency-selective oscillation state at said second frequency, wherein the level of said reflection component is so set as to make said amplification and said frequency-selective oscillation by said amplifier means remain in the region where said amplifier means exhibits linear input-output characteristics.

2. A frequency-conversion apparatus as set forth in claim 1, in which said positive feedback means comprises a series connection of: band-pass filter means having a center frequency equal to said second frequency for filtering said reflection component; phase adjustor means for phase-adjusting said reflection component; and attenuator means for adjusting the amplitude of said reflection component.

3. A frequency-conversion apparatus as set forth in claim 1, in which said amplifier means comprises an amplifier for amplifying both said first- and second-frequency signals; a circulator for leading the output of said input section and said second-frequency signal from said positive feedback means to said amplifier; and an isolator for leading the output of said amplifier to said frequency-mixer means.

4. A frequency-converter apparatus as set forth in claim 1, in which said amplifier means comprises a dual-gate type field-effect transistor for amplifying both said first- and second-frequency signals, one of said dual-gate being supplied with said second-frequency signal from said positive feedback means; a first isolator for leading the output of said input section to the other of said dual-gate; and a second isolator for leading the output of said field-effect transistor to said frequency-mixer means.

5. A frequency-conversion apparatus as set forth in claim 4, in which said input section comprises a connection line for directing said first-frequency signal to said amplifier means.

6. A frequency-conversion apparatus as set forth in claim 1, in which said frequency-mixer means comprises a circulator for leading the output of said amplifier means to said nonlinear element and for leading said reflection component to said positive feedback means; and a band-pass filter coupled to said nonlinear element and having a center frequency equal to said third frequency.

7. A frequency-conversion apparatus as set forth in claim 1, in which said frequency-mixer means comprises a band-rejection filter having a center frequency equal to the image frequency of said first frequency with respect to said second frequency for filtering the output of said amplifier means; a circulator for leading the output of said band-rejection filter to said nonlinear element and for leading said reflection component to said positive feedback means; and a band-pass filter coupled to said nonlinear element and having a center frequency equal to said third frequency.

8. A frequency-conversion apparatus as set forth in claim 1, in which said input section comprises a circulator for leading said first-frequency signal to a band-pass filter having a center frequency equal to said first frequency.

9. A frequency-conversion apparatus as set forth in claim 1, in which said input section comprises a band-rejection filter having a center frequency equal to said second frequency.

10. A frequency-conversion apparatus adapted to frequency-mix a signal of a first frequency and a signal of a second frequency for frequency conversion to a signal of a third frequency, said frequency-conversion apparatus comprising frequency-mixer means having a nonlinear element supplied with said first- and second-frequency signals for frequency-mixing said first- and second-frequency signals to provide said third-frequency signal, said nonlinear element being set to cause a part of said second-frequency signal to be reflected as a first reflection component;

amplifier means supplied with the output of said frequency-mixer means for amplifying both said third-frequency signal and said first reflection component;

extraction means supplied with the output of said amplifier means for extracting said third-frequency signal and for reflecting said second-frequency signal as a second reflection component; and positive feedback means for supplying said second reflection component to said frequency-mixer means to drive said amplifier means into a frequency-selective oscillation state at said second frequency, wherein the level of said second reflection component is so set to make said amplification and said frequency-selective oscillation by said amplifier means remain in the region where said amplifier means exhibits linear input-output characteristics.

11. A frequency-conversion apparatus as set forth in claim 10, in which said frequency-mixer means comprises a circulator for leading said second-frequency signal to said nonlinear element and for leading said third-frequency signal and said first reflection component to said amplifier means.

12. A frequency-conversion apparatus as set forth in claim 10, in which said positive feedback means comprises a series connection of: band-pass filter means having a center frequency equal to said second frequency for filtering said second reflection component; phase adjuster means to phase-adjusting said second reflection component; and attenuator means for adjusting the amplitude of said second reflection component.

13. A frequency-conversion apparatus as set forth is claim 10, in which said extraction means comprises a circulator for leading the output of said amplifier means to a band-pass filter and for leading said second reflection component from said band-pass filter to said positive feedback means, said band-pass filter having a center frequency equal to said third frequency.

14. A frequency-conversion apparatus as set forth in claim 10, in which said amplifier means comprises an amplifier for amplifying both said third-frequency signal and said first reflection component; a first isolator for leading the output of said frequency-mixer means to said amplifier; and a second isolator for leading the output of said amplifier to said extraction means.

* * * * *